US010820443B2

United States Patent
Oki et al.

(10) Patent No.: US 10,820,443 B2
(45) Date of Patent: Oct. 27, 2020

(54) TRAY UNIT

(71) Applicant: SUMITOMO ELECTRIC INDUSTRIES, LTD., Osaka-shi, Osaka (JP)

(72) Inventors: Eisuke Oki, Komaki (JP); Tomomi Imakawa, Komaki (JP); Takayuki Yokochi, Komaki (JP); Takayasu Yamauchi, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 106 days.

(21) Appl. No.: 16/162,715

(22) Filed: Oct. 17, 2018

(65) Prior Publication Data

US 2019/0116683 A1    Apr. 18, 2019

(30) Foreign Application Priority Data

Oct. 18, 2017    (JP) .................. 2017-201775

(51) Int. Cl.
| | |
|---|---|
| *H05K 7/14* | (2006.01) |
| *G02B 6/44* | (2006.01) |
| *H04Q 1/14* | (2006.01) |
| *H05K 7/18* | (2006.01) |

(52) U.S. Cl.
CPC ......... *H05K 7/1487* (2013.01); *G02B 6/4452* (2013.01); *H04Q 1/14* (2013.01); *H05K 7/1489* (2013.01); *H05K 7/183* (2013.01)

(58) Field of Classification Search
CPC .... H05K 7/1487; H05K 7/1489; H05K 7/183; H04Q 1/14; G02B 6/4452
USPC ........... 211/26, 126.1–126.5, 126.14–126.16, 211/88.01, 88.02; 720/601–615;
(Continued)

(56) References Cited

U.S. PATENT DOCUMENTS

| | | | | |
|---|---|---|---|---|
| 2,004,025 A | * | 6/1935 | Van Voorst, Jr. | ....... F24C 15/16 |
| | | | | 211/162 |
| 2,013,284 A | * | 9/1935 | Michaud | ................... A47F 1/12 |
| | | | | 211/59.2 |

(Continued)

FOREIGN PATENT DOCUMENTS

| | | | |
|---|---|---|---|
| JP | 2000-102431 A | 4/2000 |
| JP | 2009-153667 A | 7/2009 |

(Continued)

*Primary Examiner* — Jonathan Liu
*Assistant Examiner* — Devin K Barnett
(74) *Attorney, Agent, or Firm* — Faegre Drinker Biddle & Reath LLP

(57) ABSTRACT

A tray unit includes: a plurality of trays each of which has a protrusion at a side end portion thereof; and a pair of frames vertically provided with a plurality of tiers of rail portions, the plurality of tiers of rail portions accommodating the plurality of trays in a slidable manner in a horizontal direction. And the rail portion at each tier include a clamp on a surface facing the side end portion of the tray, the clamps in the plurality of tiers are aligned in a vertical direction, the clamp has an opening to which the protrusion is fittable, and when the side end portion of the tray move to a predetermined position with respect to the rail portion, the clamp is elastically deformed in the vertical direction of the rail portion, and the protrusion is fitted into the opening.

3 Claims, 13 Drawing Sheets

(58) Field of Classification Search
USPC ......... 369/30.42, 30.68, 30.69, 30.53, 30.54, 369/30.83, 30.84; 312/223.2, 333, 223.3
See application file for complete search history.

(56) References Cited

U.S. PATENT DOCUMENTS

| | | | | |
|---|---|---|---|---|
| 2,570,504 | A * | 10/1951 | Van House | B62B 1/262 280/47.19 |
| 2,579,704 | A * | 12/1951 | Saul, Jr. | A47F 5/0025 211/128.1 |
| 3,593,470 | A * | 7/1971 | Francis | E06B 7/28 52/36.4 |
| 3,999,775 | A * | 12/1976 | Brongo | B62B 3/003 280/79.2 |
| 4,013,173 | A * | 3/1977 | Snijders | A47B 57/485 211/126.15 |
| 4,051,789 | A * | 10/1977 | Howitt | A47B 57/10 108/152 |
| 4,086,858 | A * | 5/1978 | Howitt | A47B 57/34 108/110 |
| 5,200,938 | A * | 4/1993 | Akiyama | G11B 17/223 206/445 |
| 5,267,225 | A * | 11/1993 | Fukasawa | G11B 17/0285 360/98.06 |
| 5,464,103 | A * | 11/1995 | O'Brien | A47B 57/20 211/133.3 |
| 5,678,705 | A * | 10/1997 | Tolbanos | A47J 47/08 211/126.1 |
| 5,844,880 | A * | 12/1998 | Motoki | G11B 17/22 720/614 |
| 5,903,538 | A * | 5/1999 | Fujita | G11B 17/225 369/30.76 |
| 5,954,301 | A * | 9/1999 | Joseph | H01R 9/2416 248/68.1 |
| 5,970,036 | A * | 10/1999 | Matsugase | G11B 17/056 360/99.07 |
| 6,009,069 | A * | 12/1999 | Yamashita | G11B 23/0323 369/30.83 |
| 6,031,811 | A * | 2/2000 | Umesaki | G11B 17/056 369/30.92 |
| 6,178,152 | B1 * | 1/2001 | Becker | G11B 17/021 369/30.82 |
| 6,359,843 | B1 * | 3/2002 | Motoki | G11B 17/30 369/30.77 |
| 6,547,289 | B1 * | 4/2003 | Greenheck | E05B 65/46 292/100 |
| 7,159,225 | B2 * | 1/2007 | Sakano | G11B 17/225 369/30.92 |
| 8,356,312 | B2 * | 1/2013 | Takasawa | G11B 17/223 369/30.83 |
| 8,589,961 | B2 * | 11/2013 | Takasawa | G11B 23/0323 369/30.68 |
| 8,777,024 | B2 * | 7/2014 | Kramer | A47B 57/42 211/187 |
| 10,118,561 | B2 * | 11/2018 | James-Moore | A47B 47/00 |
| 2002/0191939 | A1 * | 12/2002 | Daoud | G02B 6/4471 385/135 |
| 2003/0090967 | A1 * | 5/2003 | Mizuno | G11B 17/056 369/30.94 |
| 2004/0190390 | A1 * | 9/2004 | Hara | G11B 17/056 369/30.03 |
| 2004/0190392 | A1 * | 9/2004 | Shirakawa | G11B 17/056 369/30.03 |
| 2004/0240332 | A1 * | 12/2004 | Meng | G11B 17/056 369/30.99 |
| 2005/0141355 | A1 * | 6/2005 | Chen | G11B 17/056 369/30.27 |
| 2005/0204373 | A1 * | 9/2005 | Ueno | G11B 17/047 720/616 |
| 2006/0010462 | A1 * | 1/2006 | Lin | G11B 17/225 720/614 |
| 2006/0136941 | A1 * | 6/2006 | Kuo | G11B 17/225 720/610 |
| 2006/0143625 | A1 * | 6/2006 | Chuo | G11B 17/223 720/614 |
| 2007/0131632 | A1 * | 6/2007 | Brown | A47F 3/14 211/126.13 |
| 2009/0003145 | A1 * | 1/2009 | Lee | G11B 17/056 369/30.32 |
| 2009/0122661 | A1 * | 5/2009 | Lee | G11B 17/30 369/30.92 |
| 2009/0222845 | A1 * | 9/2009 | Ataguchi | G11B 17/056 720/614 |
| 2009/0222846 | A1 * | 9/2009 | Ataguchi | G11B 17/30 720/614 |
| 2009/0222847 | A1 * | 9/2009 | Yamazaki | G11B 17/056 720/614 |
| 2013/0139189 | A1 * | 5/2013 | Yamasaki | G11B 17/056 720/613 |
| 2014/0151317 | A1 * | 6/2014 | Shih | G11B 33/022 211/126.3 |
| 2014/0354001 | A1 * | 12/2014 | Hanley | B60P 3/007 296/24.44 |
| 2015/0048040 | A1 * | 2/2015 | Chang | A47B 96/1416 211/126.16 |
| 2016/0077298 | A1 * | 3/2016 | Wiltjer | G02B 6/4452 211/126.15 |
| 2017/0014016 | A1 * | 1/2017 | Chan | A47F 5/04 |
| 2018/0372977 | A1 * | 12/2018 | Vermeulen | G02B 6/4455 |
| 2019/0317294 | A1 * | 10/2019 | Geens | G02B 6/4477 |
| 2020/0100392 | A1 * | 3/2020 | Iyengar | H05K 7/20509 |

FOREIGN PATENT DOCUMENTS

| | | |
|---|---|---|
| JP | 2009-158630 A | 7/2009 |
| JP | 2009-164448 A | 7/2009 |
| JP | 2009-165501 A | 7/2009 |

\* cited by examiner

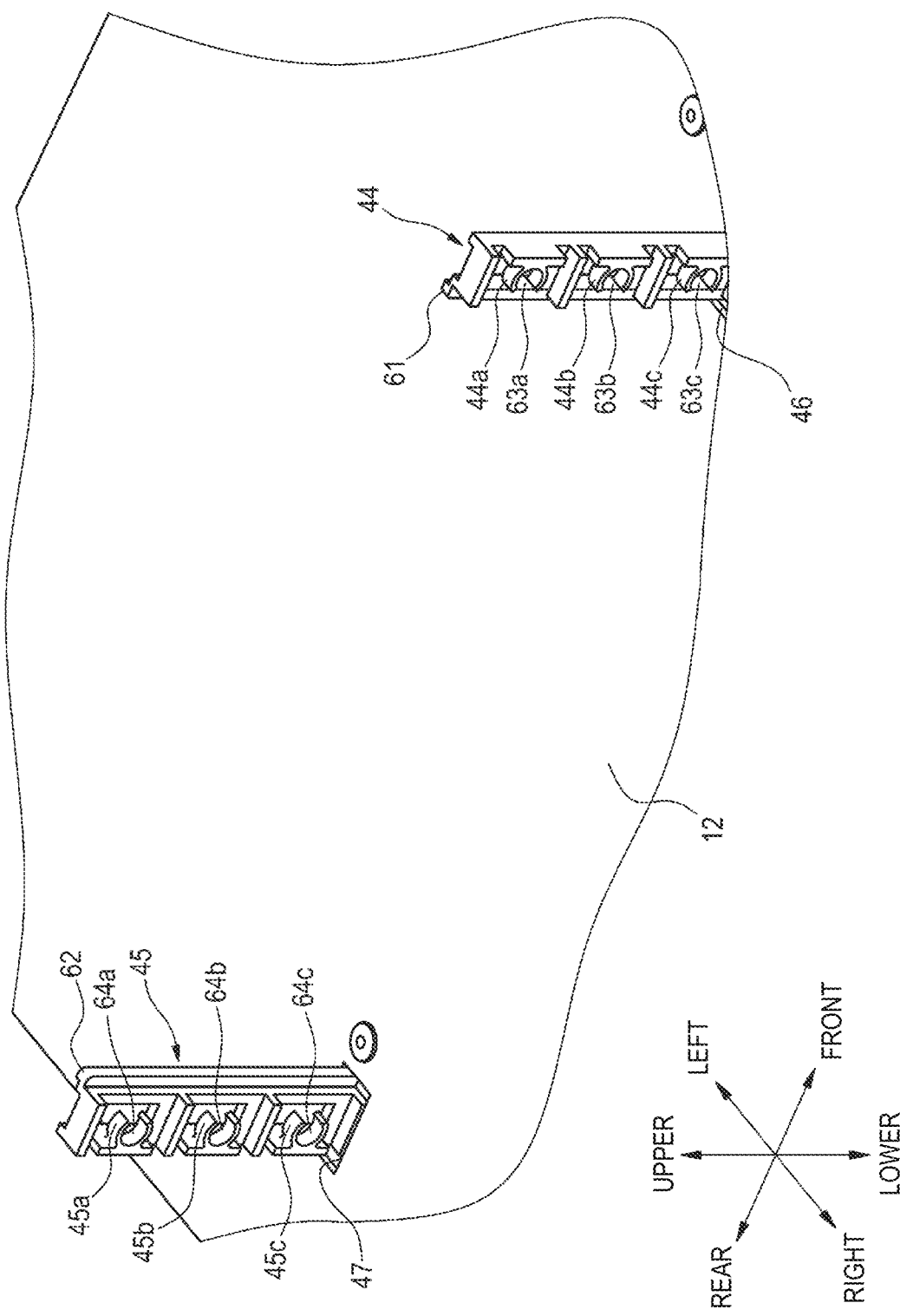

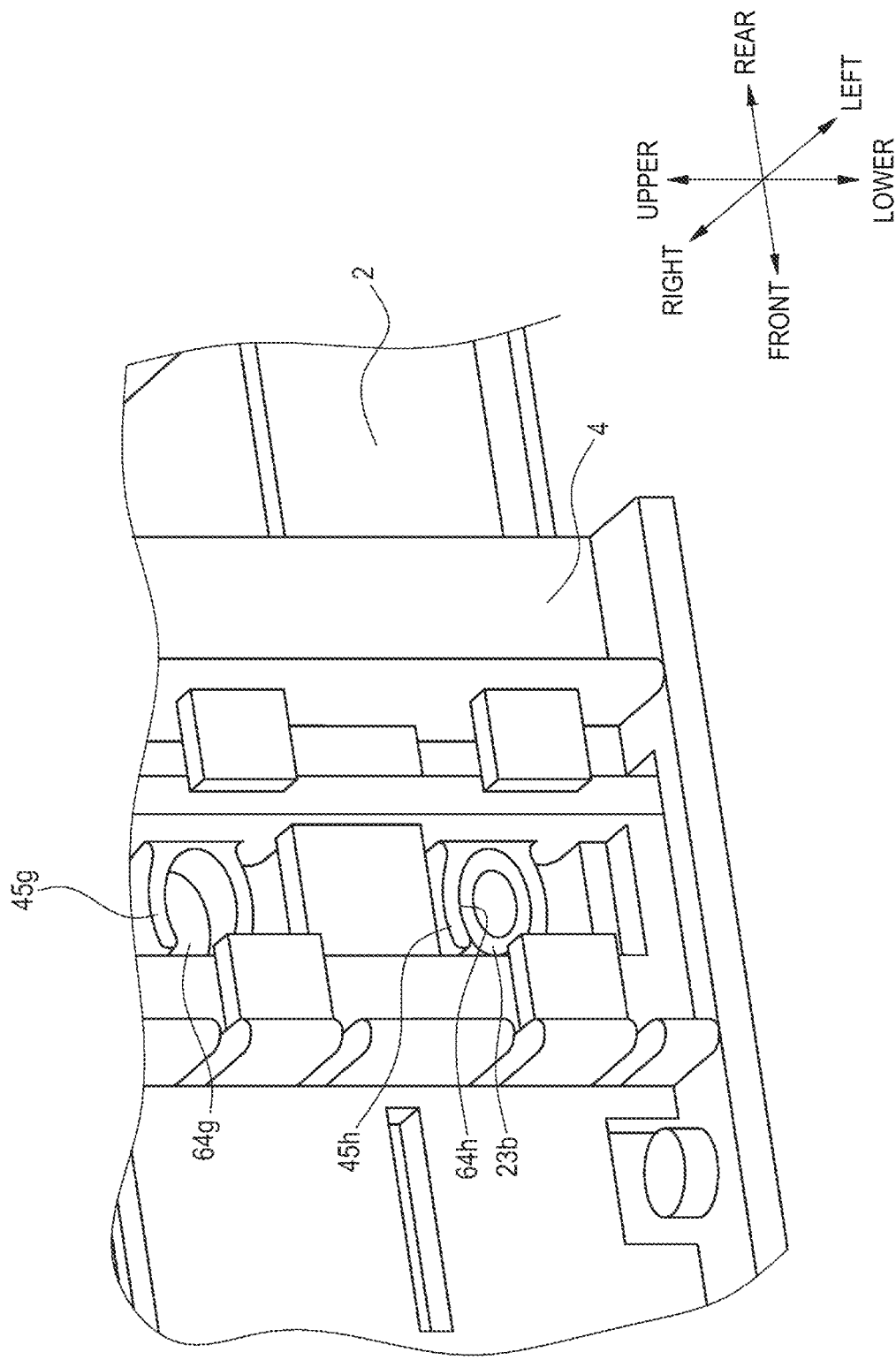

TRAY UNIT

CROSS-REFERENCE TO RELATED APPLICATION

This application claims priority from Japanese Patent Application No. 2017-201775, filed on October, 2017, the entire subject matter of which is incorporated herein by reference.

TECHNICAL FIELD

The present invention relates to a tray unit.

BACKGROUND

A unit case which is mounted on a rack for electrical and electronic equipment and includes a slide rail accommodating a tray in a unit main body in a slidable manner is known (for example, refer to Japanese Patent Application Laid-Open Publication No. 2009-164448 (Patent Literature 1), Japanese Patent Application Laid-Open Publication No. 2009-165501 (Patent Literature 2), Japanese Patent Application Laid-Open Publication No. 2009-158630 (Patent Literature 3), Japanese Patent Application Laid-Open Publication No. 2009-153667 (Patent Literature 4), and Japanese Patent Application Laid-Open Publication No. 2000-102431 (Patent Literature 5)).

The slide rails of the unit cases described in Patent Literatures 1 to 5 have a complicated structure in which the width thereof gradually increases, resulting in an increase in the height of the unit case.

In addition, only one tray is accommodated in one unit case. Thus, when a plurality of tiers of trays are stacked in the vertical direction in the rack, the tray accommodation size in the rack in the vertical direction may increase.

In this way, there is no technique in the related art to provide a tray unit capable of reducing the tray accommodation size in the rack in the vertical direction, when stacking a plurality of tiers of trays in the vertical direction in the rack.

SUMMARY

A tray unit according to an aspect of the present invention includes: a plurality of trays each of which has a protrusion at a side end portion thereof; and a pair of frames vertically provided with a plurality tiers of rail portions, the plurality of tiers of rail portions accommodating the plurality of trays in a slidable manner in a horizontal direction. And the rail portion at each tier include a clamp on a surface facing the side end portion of the tray, the clamps in the plurality of tiers are aligned in a vertical direction, the clamp has an opening to which the protrusion is fittable, and when the side end portion of the tray move to a predetermined position with respect to the rail portion, the clamp is elastically deformed in the vertical direction of the rail portion, and the protrusion is fitted into the opening.

It becomes possible to provide a tray unit capable of reducing the tray accommodation size in the rack in the vertical direction, when stacking a plurality of tiers of trays in the vertical direction in the rack.

BRIEF DESCRIPTION OF DRAWINGS

Exemplary embodiments of the present invention will be described in detail based on the following figures, wherein:

FIG. 5 is a view illustrating a method of inserting the clamp coupling body into the frame;

FIG. 7B is a view illustrating a clamp fitted with the protrusion in a tray accommodation state;

DETAILED DESCRIPTION

Figure 1:
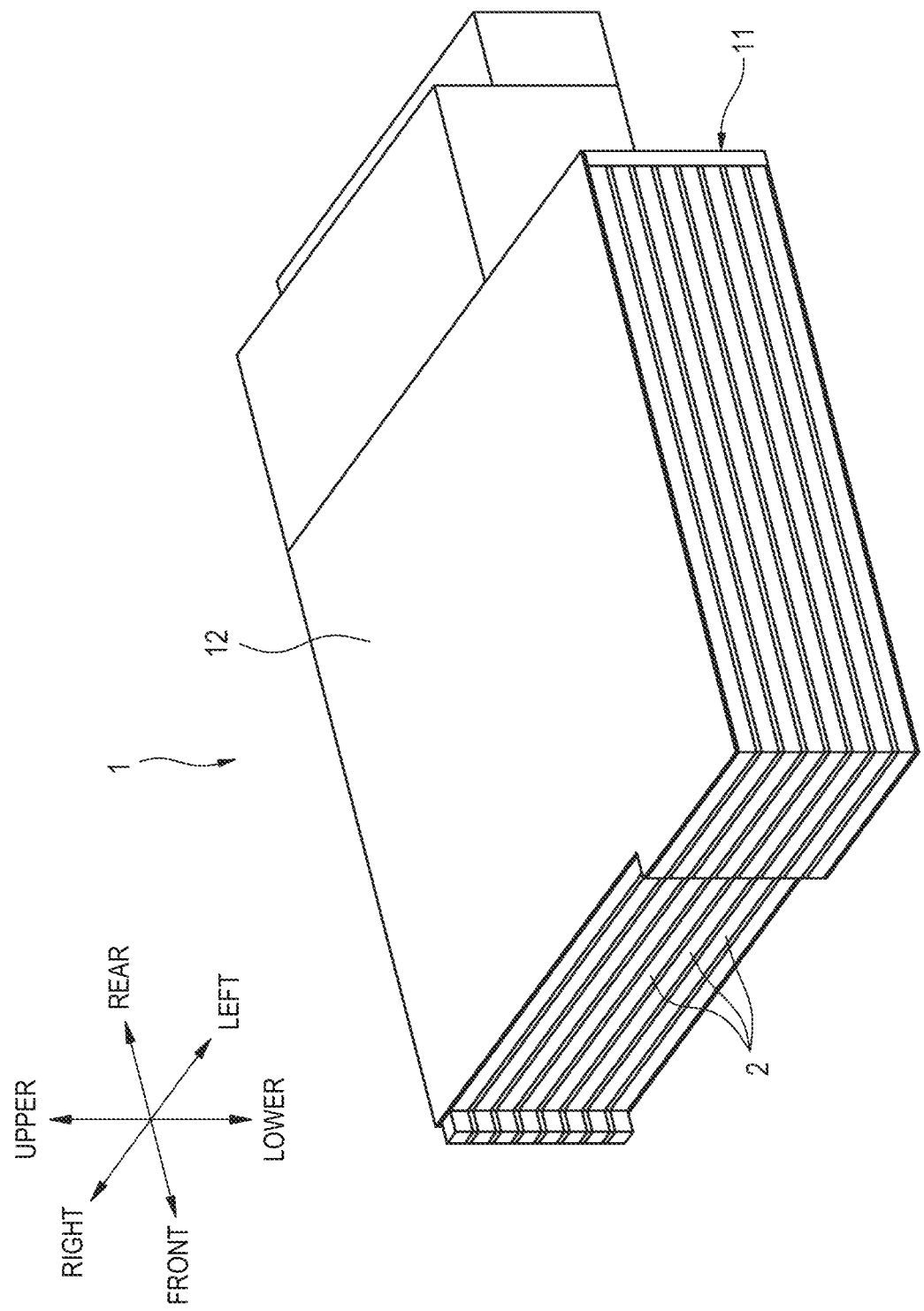
FIG. 1 is an external view illustrating a tray unit according to embodiments.

Description of Embodiments of the Present Invention

First, embodiments of the present invention will be described as follows.

(1) A tray unit according to an aspect of the present invention, including:

a plurality of trays each of which has a protrusion at a side end portion thereof; and a pair of frames vertically provided with a plurality tiers of rail portions, the plurality of tiers of rail portions accommodating the plurality of trays in a slidable manner in a horizontal direction, wherein the rail portion at each tier include a clamp on a surface facing the side end portion of the tray, the clamps in the plurality of tiers are aligned in a vertical direction, the clamp has an opening to which the protrusion is fittable, and when the side end portion of the tray move to a predetermined position with respect to the rail portion, the clamp is elastically deformed in the vertical direction of the rail portion, and the protrusion is fitted into the opening.

According to the above configuration, since the tray unit has a relatively simple structure in which each of the rail portions provided in plural tiers on the frame of the tray unit is provided with the clamp elastically deformed in the vertical direction, so that the protrusion is fitted into the opening, and is aligned in the vertical direction, it is possible to reduce the height per rail portion, that is, one tray. Further, it is possible to accommodate the plurality of tiers of trays in one tray unit. Therefore, when stacking the plurality of tiers of trays in the vertical direction in the rack, the tray accommodation size in the rack in the vertical direction can be reduced.

(2) The clamps in the plurality of tiers aligned in the vertical direction may be coupled to form a clamp coupling body, the clamp coupling body may be a separate structure from the frame, and the clamp coupling body may be inserted in the vertical direction with respect to the frame to assemble the tray unit.

According to the above configuration, since the frame and the clamp coupling body are separate structures in the tray unit, manufacturing the tray unit is easily performed compared to the case of an integral structure. In addition, since the tray unit can be assembled by inserting the clamp coupling body in the vertical direction with respect to the frame, assembly work of the tray unit is also easily performed.

(3) The clamp coupling body may be formed in a vertically symmetrical shape, and when viewed from the vertical direction, the clamp coupling body may be asymmetric in a front-rear direction.

According to the above configuration, since the clamp coupling body is vertically symmetrical, it is possible to reduce the manufacturing cost by sharing a mold for manufacturing each clamp coupling body, for example. Further, when inserting the clamp coupling body in the vertical direction into the frame, since the clamp coupling body is asymmetric in the front-rear direction when viewed from the operator, it is possible to assemble the tray unit without mistaking the orientation of the front and rear.

(4) The clamp coupling body may include a recess portion provided in the horizontal direction at upper and lower end portions thereof.

According to the above configuration, by hooking the tip of the tool or the like in the recess portion provided in the horizontal direction of the end portion of the clamp coupling body, the clamp coupling body can be easily pulled out from the frame. As a result, the maintenance work or the like of the tray can be easily performed.

Details of Embodiments of the Present Invention

A specific example of a tray unit according to embodiments of the present invention will be described below with reference to the drawings.

It should be noted that the present invention is not limited to these illustrative examples, but is indicated by the scope of the claims, and it is intended that all modifications within meaning and scope equivalent to the claims are included.

FIG. 1 is an external view illustrating a tray unit according to the present embodiments. As illustrated in FIG. 1, a tray unit 1 includes a plurality of trays 2 (eight tiers in the present embodiments) stacked in the vertical direction. Each tray 2 is, for example, provided with a connection portion and the like to which an optical cable introduced from an outside line is connected at a telephone station, a data center, or the like. The connection portions and the like are aligned in a stacked state on a rack or the like, for example.

The tray 2 accommodated in the tray unit 1 is fixed to a housing 11. The upper side of the tray 2 fixed to the housing 11 is covered with a top plate 12.

Figure 2:
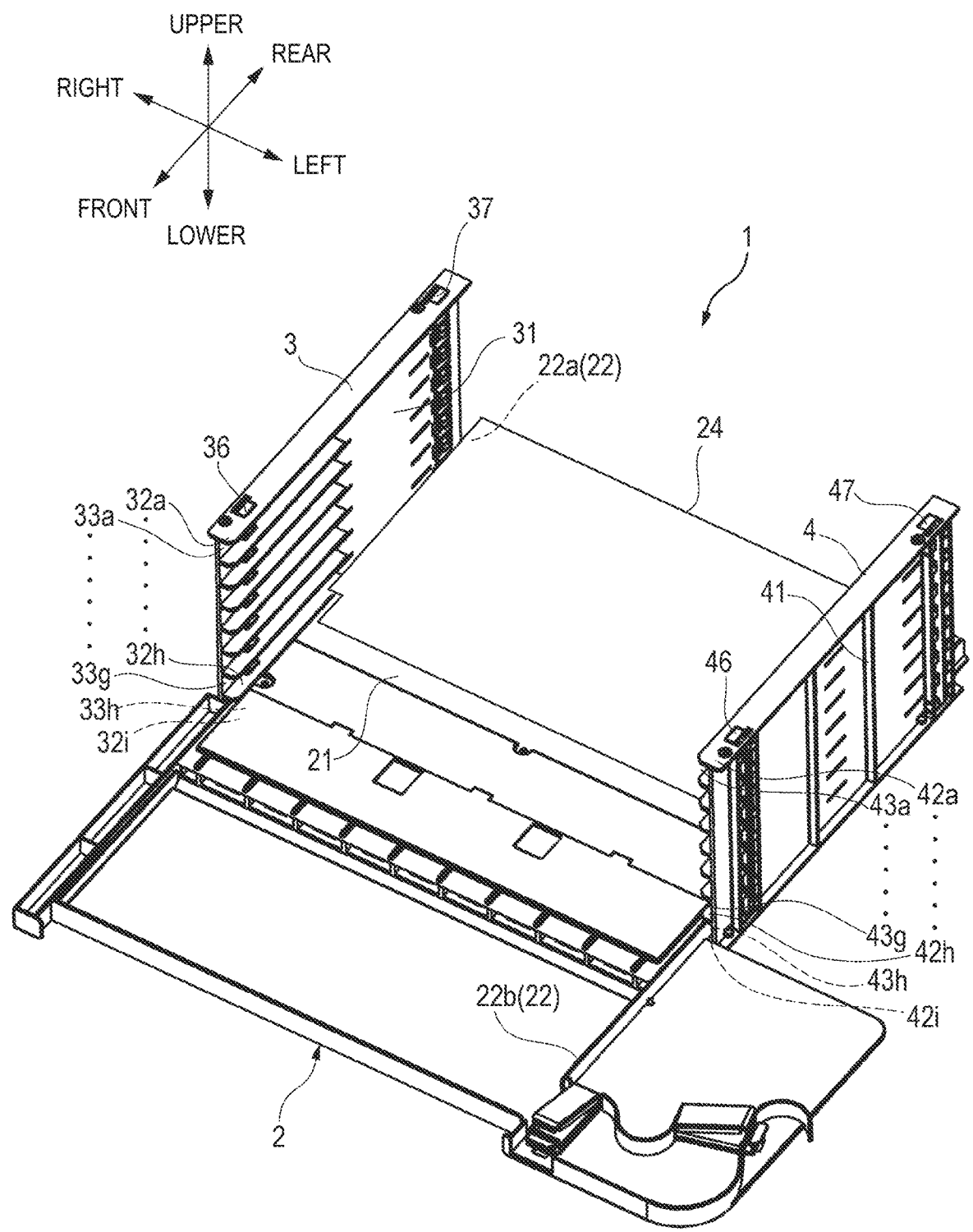
FIG. 2 is a view illustrating frames and a tray of the tray unit.

FIG. 2 is a view illustrating the tray unit 1 with the top plate 12, the housing 11, and the optical cable, connection portions, and the like disposed in the trays 2 removed. In addition, FIG. 2 is a view illustrating the tray unit 1 with only one tray 2 being attached thereto. As illustrated in FIG. 2, the tray unit 1 includes a pair of frames (a frame 3 on the right side and a frame 4 on the left side) arranged to face opposite side portions in the left-right direction.

The frames 3 and 4 respectively include rectangular base plate portions 31 and 41, and a plurality (nine in the present embodiments) of guide plates 32 (32a to 32i) and 42 (42a to 42i) provided on the base plate portions 31 and 41.

The base plate portions 31 and 41 are provided to be erect in the vertical direction from the opposite side portions in the left-right direction of the tray unit 1 to extend in a front-rear direction.

The guide plates 32a to 32i are provided to extend in the front-rear direction on the left side surface (inner side surface) of the base plate portion 31 with the plate surface facing the vertical direction. The guide plates 42a to 42i are provided to extend in the front-rear direction on the right side surface (inner side surface) of the base plate portion 41 with the plate surface facing the vertical direction. Each of the guide plates 32a to 32i and each of the guide plates 42a to 42i are provided in parallel at equal intervals. The guide plates 32a to 32i and the guide plates 42a to 42i are provided to face each other respectively.

The guide plates 32a to 32i and the guide plates 42a to 42i are formed such that the uppermost guide plates 32a and 42a and the lowermost guide plates 32i and 42i have the same length as the length of the base plate portions 31 and 41 in the front-rear direction. The other guide plates 32b to 32h and 42b to 42h are formed to have a length shorter than the length of the base plate portions 31 and 41 in the front-rear direction. The guide plates 32b to 32h and 42b to 42h formed to be shorter are disposed close to the front side of the base plate portions 31 and 41.

In the base plate portions 31 and 41, the guide plates 32a to 32i and 42a to 42i are provided in parallel so that a plurality of tiers of guide paths 33a to 33h and 43a to 43h are formed to extend in the front-rear direction of the tray unit 1 between the respective guide plates. These guide paths 33a to 33h and 43a to 43h form a "rail portion" with which the tray 2 can be pulled out or accommodated in the tray unit 1 slidably in the horizontal direction along the front and rear of the tray unit 1.

On the rear side of the frames 3 and 4, a partition plate 24 is installed between the trays 2 at each tier. The partition plate 24 serves to prevent optical cables or the like extending to the rear side of the tray 2 from being caught when the tray 2 is pulled out or accommodated in the front-rear horizontal direction of the tray unit 1.

The tray 2 includes a bottom plate 21 and side walls 22 (a right side wall 22a and a left side wall 22b) provided to be erect in the vertical direction on both side portions in the left-right direction of the bottom plate 21.

The tray 2 are inserted into the rail portions 33a to 33h and 43a to 43h such that the side walls 22 (the right side wall 22a and the left side wall 22b) on both sides in the left-right direction of the tray 2 face the base plate portions 31 and 41 of the frames 3 and 4, respectively. The tray 2 slides in the front-rear direction along the rail portions 33a to 33h and 43a to 43h.

The lowermost guide plates 32i and 42i in the frames 3 and 4 are fixed to the housing 11 (see FIG. 1), for example, with screws. The height of the frames 3 and 4 is formed to be substantially the same as and slightly lower than the inside height of the housing 11. The top plate 12 (see FIG. 1) is fixed to the housing portion 11 and the uppermost guide plates 32a and 42a of the frames 3 and 4, for example, with screws.

Figure 3:
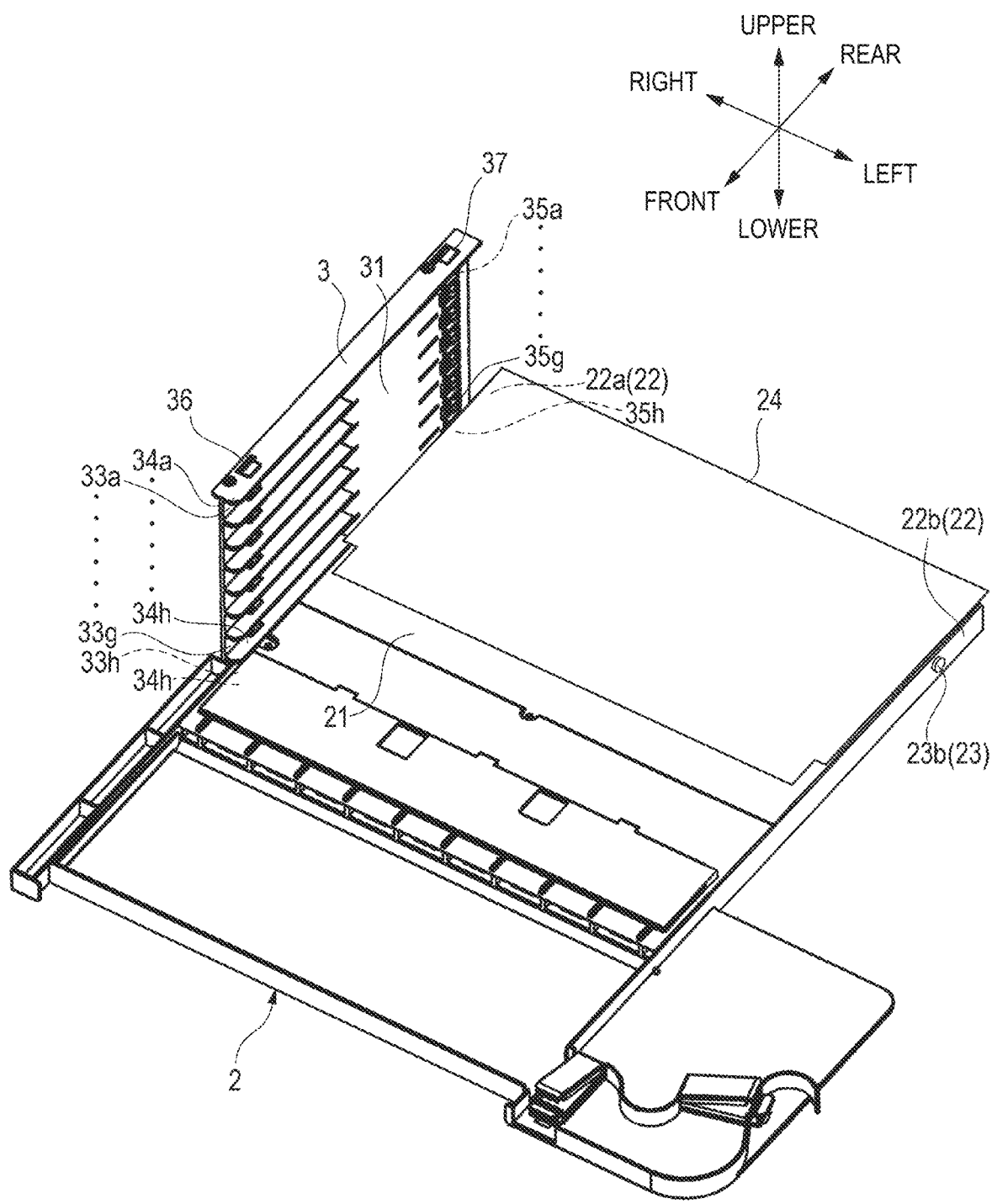
FIG. 3 is a view illustrating a protrusion on a side end portion of the tray.

FIG. 3 is a view illustrating the tray unit 1 illustrated in FIG. 2 with one frame 4 thereof being removed. As illustrated in FIG. 3, protrusions 23 are provided on the side end portions of the tray 2. In the present embodiments, a protrusion 23b is provided on the end portion on the rear (back) side of the left side wall 22b. The protrusion 23b is provided to protrude in the horizontal direction from the left side surface (outer side surface) of the side wall 22b. The shape of the protrusion 23b is, for example, a cylindrical shape, a polygonal columnar shape, or the like. In the right side wall 22a of the tray 2, a protrusion 23a (not illustrated) is formed at the same position and in the same shape as that of the protrusion 23b. The protrusions 23a and 23b of the tray 2 are formed to be fitted into the clamps provided on the frames 3 and 4.

The clamp of the frame 3 is provided on the surface of the base plate portion 31 facing the side wall 22a of the tray 2. As illustrated in FIG. 3, the frame 3 is provided with front clamps 34a to 34h provided on the front side of the frame 3 and rear clamps 35a to 35h provided on the rear side of the frame 3. Each of the front clamps 34a to 34h is disposed in each of the rail portions 33a to 33h of the respective tiers. The front clamps 34a to 34h are provided on the front side in the rail portions 33a to 33h and are provided to be aligned in the vertical direction. Each of the rear clamps 35a to 35h is provided to have the same height as each of the front clamps 34a to 34h and provided to be aligned in the vertical direction. In the frame 4 removed in FIG. 3, front clamps 44a to 44h and rear clamps 45a to 45h are provided to have the same configuration as the front clamps 34a to 34h and the rear clamps 35a to 35h of the frame 3.

Each of the trays 2 inserted into the rail portions 33a to 33h and 43a to 43h is slidable in the front-rear direction between the front clamps 34a to 34h and 44a to 44h and the rear clamps 35a to 35h and 45a to 45h. When each tray 2 is slid to the rear side and accommodated, the protrusions 23a and 23b are fitted and fixed to the rear clamps 35a to 35h and 45a to 45h. Further, when each tray 2 is slid to the front side and pulled out, the respective protrusions 23a and 23b are fitted and fixed to the front clamps 34a to 34h and 44a to 44h.

The clamps of the respective tiers arranged to be aligned in the vertical direction, that is, the front clamps 34a to 34h, the rear clamps 35a to 35h, the front clamps 44a to 44h, and the rear clamps 45a to 45h are respectively coupled to each other to form one clamp coupling body.

Figure 4:
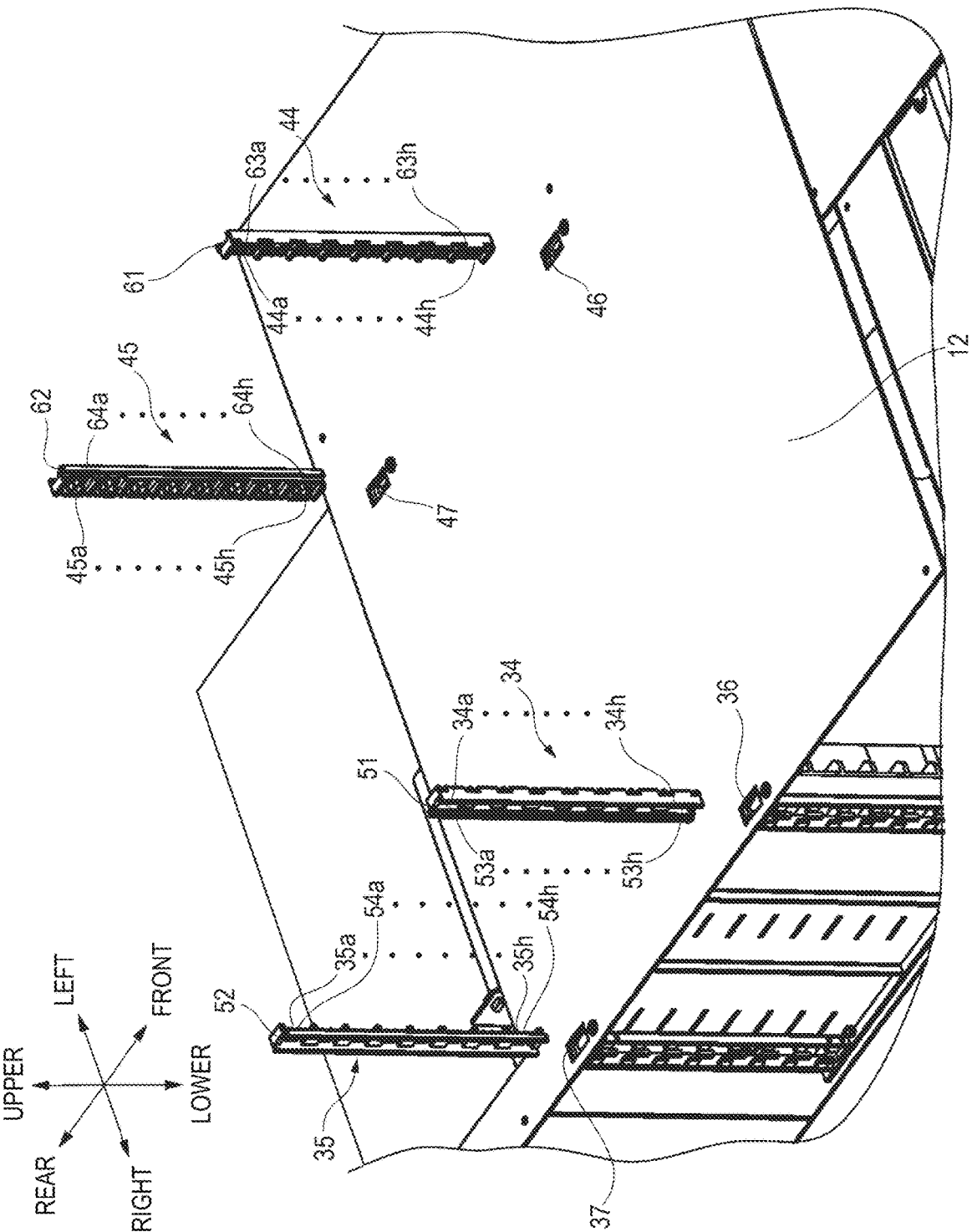
FIG. 4 is a view for describing a clamp coupling body of the tray unit.

FIG. 4 illustrates a clamp coupling body 34 including the front clamps 34a to 34h, a clamp coupling body 35 including the rear clamps 35a to 35h, a clamp coupling body 44 including the front clamps 44a to 44h, and a clamp coupling body 45 including the rear clamps 45a to 45h.

As illustrated in FIG. 4, each of the clamp coupling bodies 34, 35, 44, and 45 is formed as an independent member separate from the frames 3 and 4. The clamp coupling bodies 34, 35, 44, and 45 are inserted in the vertical direction with respect to insertion portions 36, 37, 46, and 47 formed in the frames 3 and 4 to be assemblable thereto. The insertion portions 36, 37, 46, and 47 are formed as insertion holes penetrating vertically through the frames 3 and 4. The clamp coupling bodies 34, 35, 44, and 45 are to be detachable from the insertion portions 36, 37, 46, and 47.

When assembling, first, the clamp coupling body 35 including the rear clamps 35a to 35h and the clamp coupling body 45 including the rear clamps 45a to 45h are inserted, and then all trays 2 are accommodated in the tray unit 1. Finally, the clamp coupling body 34 including the front clamps 34a to 34h and the clamp coupling body 44 including the front clamps 44a to 44h are inserted.

FIG. 5 is a view illustrating a state in the middle of inserting the clamp coupling bodies 44 and 45 into the insertion portions 46 and 47 from the upper side. As illustrated in FIGS. 4 and 5, each of the clamp coupling bodies 34, 35, 44, and 45 is formed in a vertically symmetrical shape when viewed from the front-rear direction. When viewed from the vertical direction, each of the clamp coupling bodies 34, 35, 44, and 45 is formed asymmetrically in the front-rear direction. In each of the clamp coupling bodies 34, 35, 44, and 45, protruding portions 51, 52, 61, and 62 with which the front and rear can be distinguished are provided, for example, only on one side in the front-rear direction. All clamp coupling bodies 34, 35, 44, and 45 are formed in the same structure. The clamp coupling bodies 34, 35, 44, and 45 are mounted in the insertion portions 36, 37, 46, and 47, so that the respective clamps forming each clamp coupling body are arranged at predetermined positions as illustrated in FIG. 3.

The respective clamps of the clamp coupling bodies 34, 35, 44, and 45, that is, the front clamps 34a to 34h, the rear clamps 35a to 35h, the front clamps 44a to 44h, and the rear clamps 45a to 45h, are formed with openings 53a to 53h, 54a to 54h, 63a to 63h, and 64a to 64h to which the protrusions 23a and 23b of the tray 2 can be fitted. For example, each clamp is formed in a C shape including two elastically deformable arm portions, and the C-shaped opening portion serves as each clamp opening (53a to 53h, 54a to 54h, 63a to 63h, and 64a to 64h).

When the clamp coupling bodies 34 and 35 are inserted into the insertion portions 36 and 37, the front clamps 34a to 34h and the rear clamps 35a to 35h are respectively provided to protrude from the inner surface toward the thickness direction of the base plate part 31. Similarly, when the clamp coupling bodies 44 and 45 are inserted into the insertion portions 46 and 47, the front clamps 44a to 44h and the rear clamps 45a to 45h are provided to protrude from the inner surface toward the thickness direction of the base plate part 41.

Further, when the clamp coupling bodies 34 and 35 are inserted into the insertion portions 36 and 37, the respective openings 53a to 53h of the clamp coupling body 34 and the respective openings 54a to 54h of the clamp coupling body 35 are provided to face each other. Similarly, when the clamp coupling bodies 44 and 45 are inserted into the insertion portions 46 and 47, the respective openings 63a to 63h of the clamp coupling body 44 and the respective openings 64a to 64h of the clamp coupling body 45 are provided to face each other.

Figure 6A:
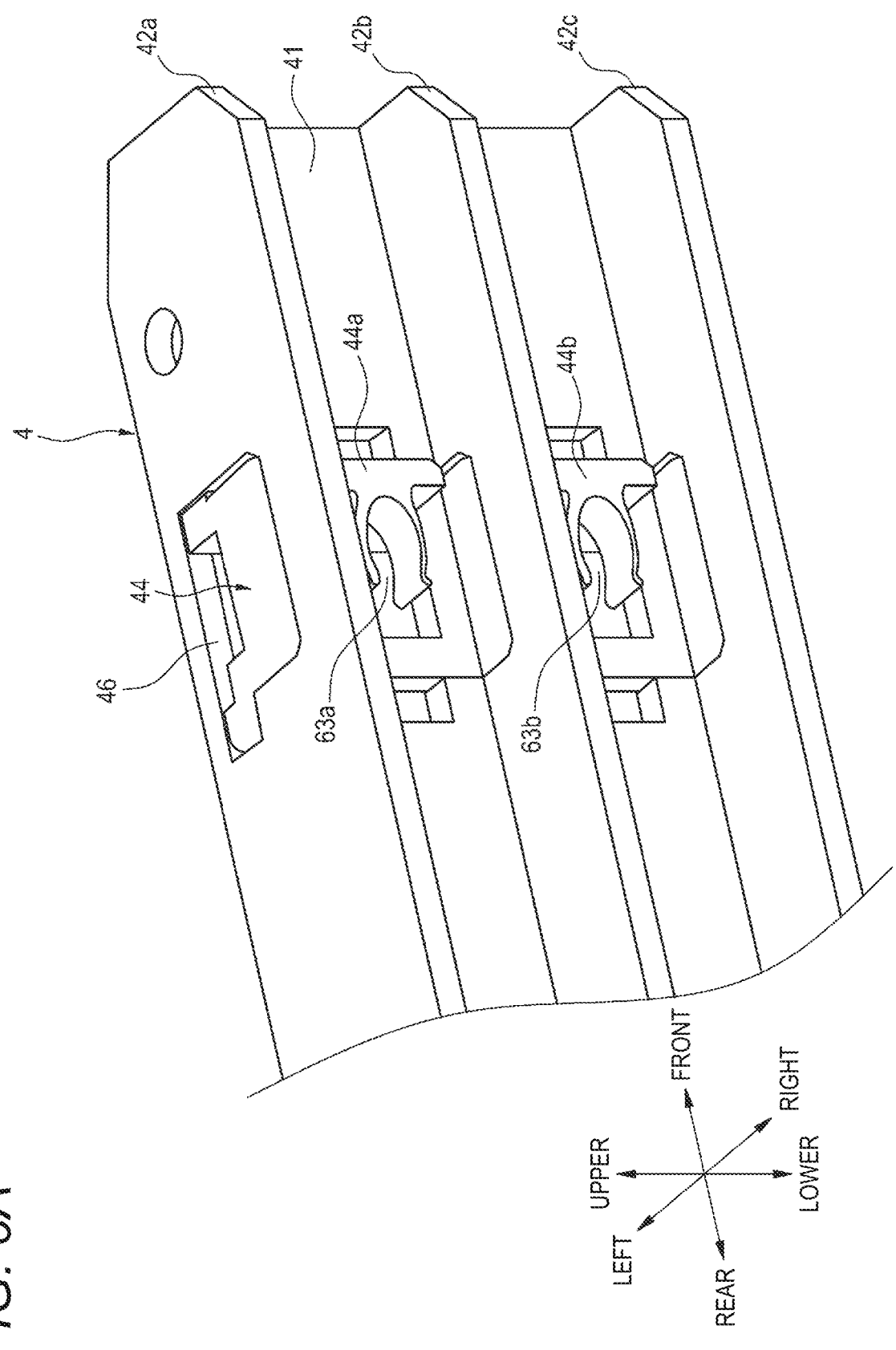
FIG. 6A is a view illustrating a state where the clamp coupling body is inserted into an insertion portion on a front side of the frame.

FIG. 6A is a view obtained by observing a state where the clamp coupling body 44 is inserted into the insertion portion 46 on the front side of the frame 4, from the side of the inner surface of the base plate portion 41. As illustrated in FIG. 6A, the opening 63a of the clamp 44a and the opening 63b of the clamp 44b of the clamp coupling body 44 are provided to face rearward. Further, the clamp 44a and the clamp 44b are provided to protrude from the inner surface toward the thickness direction of the base plate portion 41.

Figure 6B:
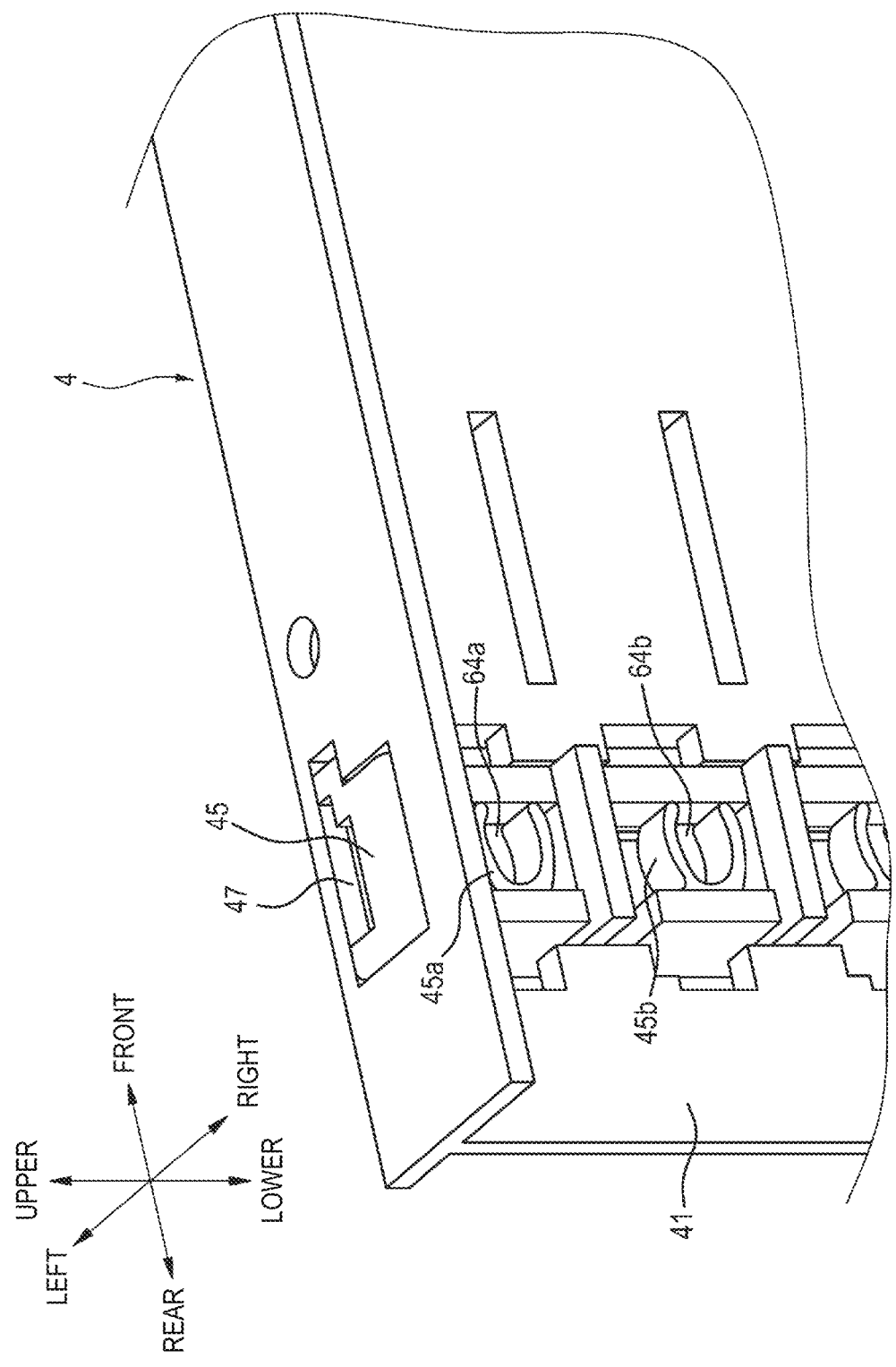
FIG. 6B is a view illustrating a state where the clamp coupling body is inserted into an insertion portion on a rear side of the frame.

FIG. 6B is a view obtained by observing a state where the clamp coupling body 45 is inserted into the insertion portion 47 on the rear side of the frame 4, from the side of the inner surface of the base plate portion 41. As illustrated in FIG. 6B, the opening 64a of the clamp 45a and the opening 64b of the clamp 45b of the clamp coupling body 45 are provided to face forward. Further, the clamp 45a and the clamp 45b are provided to protrude from the inner surface toward the thickness direction of the base plate portion 41.

Figure 7A:
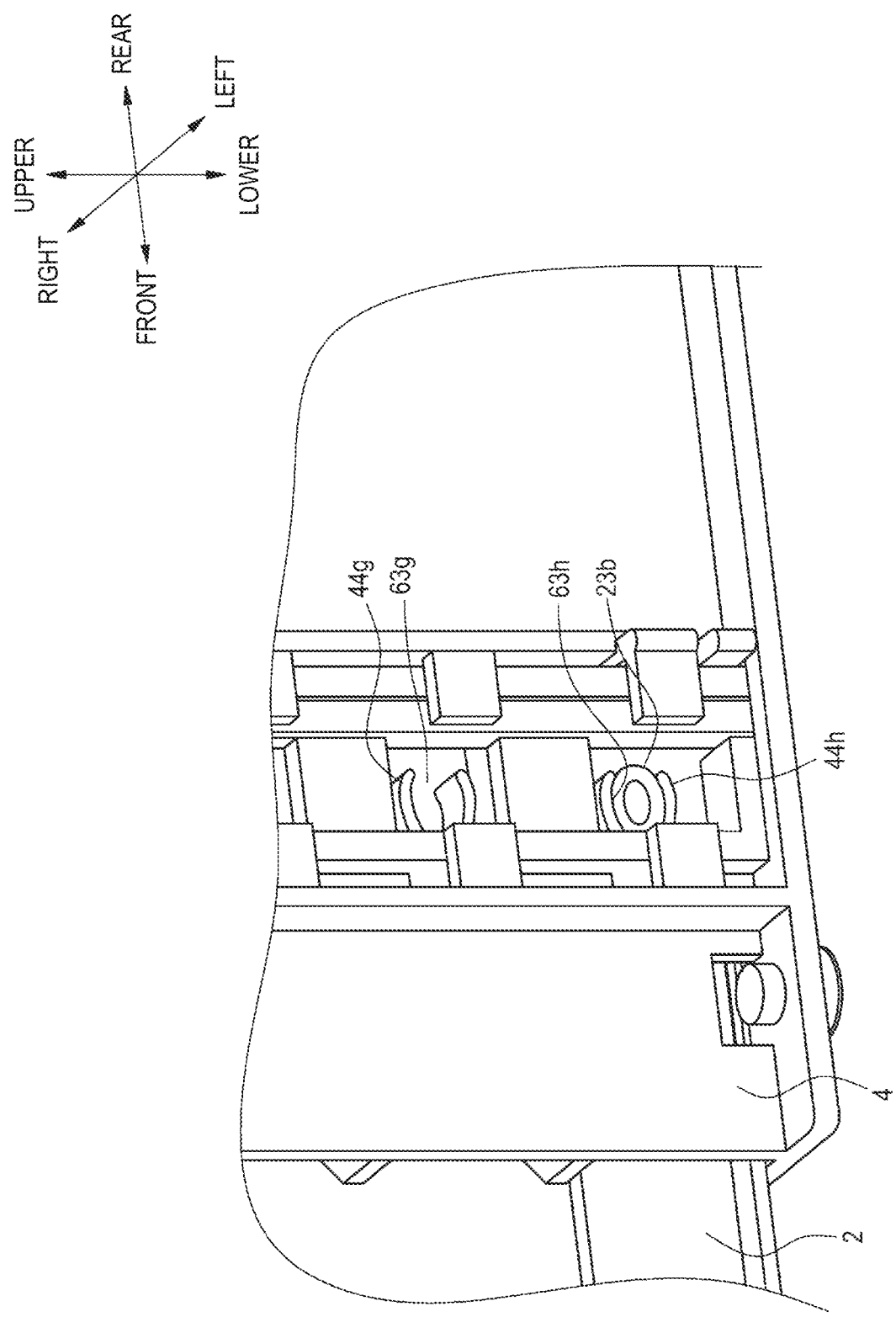
FIG. 7A is a view illustrating a clamp fitted with the protrusion in a tray pulling-out state.

FIG. 7A is a view obtained by observing a state where the tray 2 is pulled out and the protrusion 23b of the tray 2 is fitted to the clamp coupling body 44 of the frame 4, from the side of the outer surface of the base plate portion 41. As illustrated in FIG. 7A, when the tray 2 moves to a predetermined pulled-out position in front with respect to the rail portion 43h of the frame 4, the protrusion 23b comes into contact with the clamp 44h of the clamp coupling body 44 to elastically deform in the vertical direction to spread the opening 63h of the clamp 44h, whereby the protrusion 23b is fitted into the opening 63h of the clamp 44h.

FIG. 7B is a view obtained by observing a state where the tray 2 is accommodated and the protrusion 23b of the tray 2 is fitted to the clamp coupling body 45 of the frame 4, from the side of the outer surface of the base plate portion 41. As illustrated in FIG. 7B, when the tray 2 moves to a predetermined accommodated position behind with respect to the rail portion 43h of the frame 4, the protrusion 23b comes into contact with the clamp 45h of the clamp coupling body 45 to elastically deform in the vertical direction to spread the opening 64h of the clamp 45h, whereby the protrusion 23b is fitted into the opening 64h of the clamp 45h.

Next, an example of a pulling-out method when pulling out the clamp coupling bodies 34, 35, 44, and 45 from the frames 3 and 4 will be described with reference to FIGS. 8A to 8C.

Figure 8A:
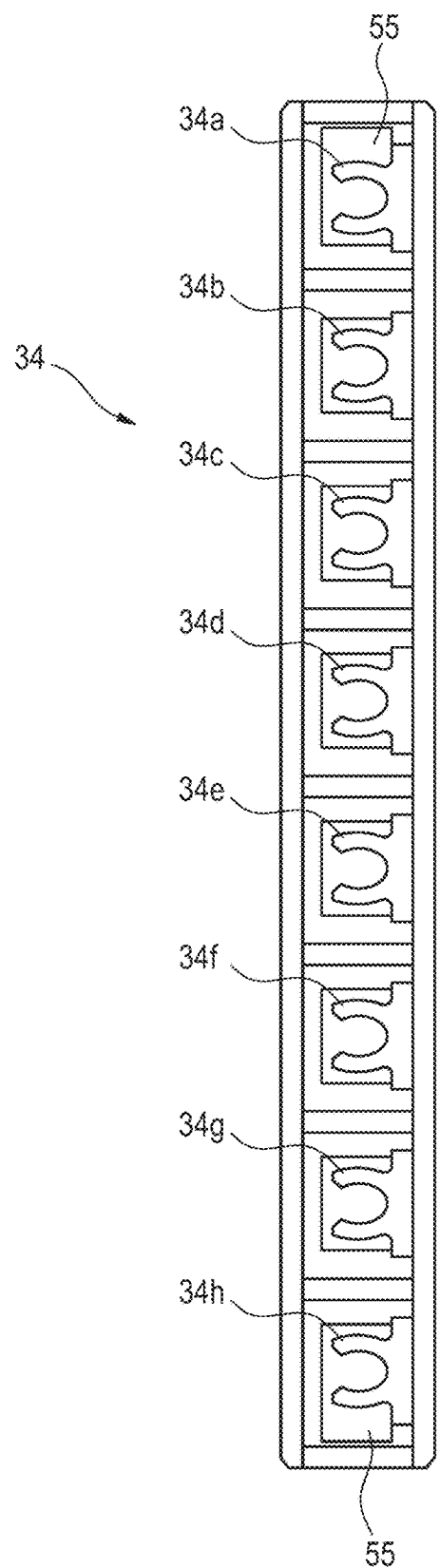
FIG. 8A is a view for describing an example of a pulling-out method of the clamp coupling body.

As illustrated in FIG. 8A, a recess portion 55 provided in the horizontal direction is formed in the upper end portion and the lower end portion of the clamp coupling body 34. The recess portions 55 are used to pull out the clamp coupling body 34. As the clamp coupling body 34, the other clamp coupling bodies 35, 44, and 45 are also formed with the recess portions 55.

Figure 8B:
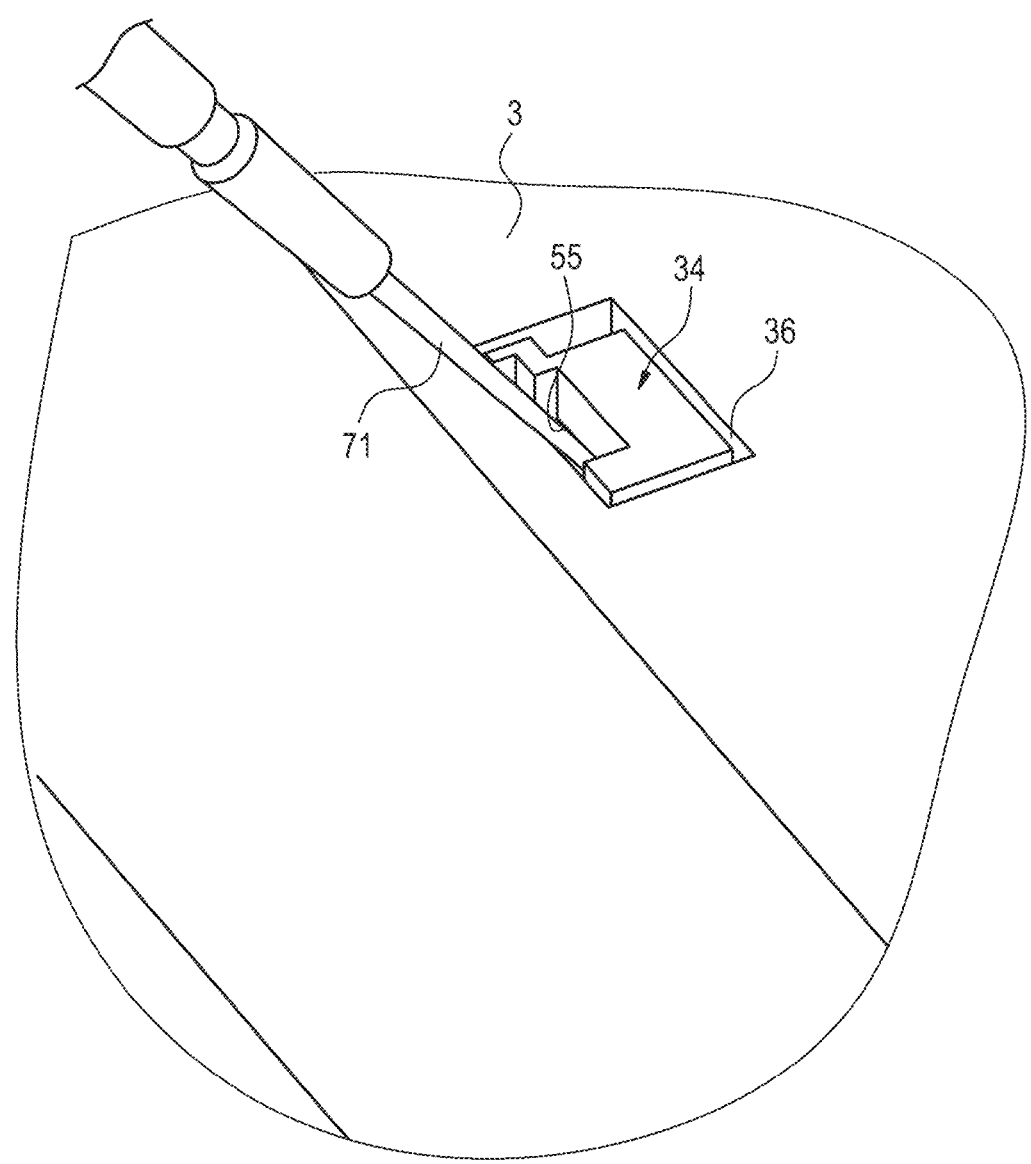
FIG. 8B is a view for describing the example of the pulling-out method of the clamp coupling body.
Figure 8C:
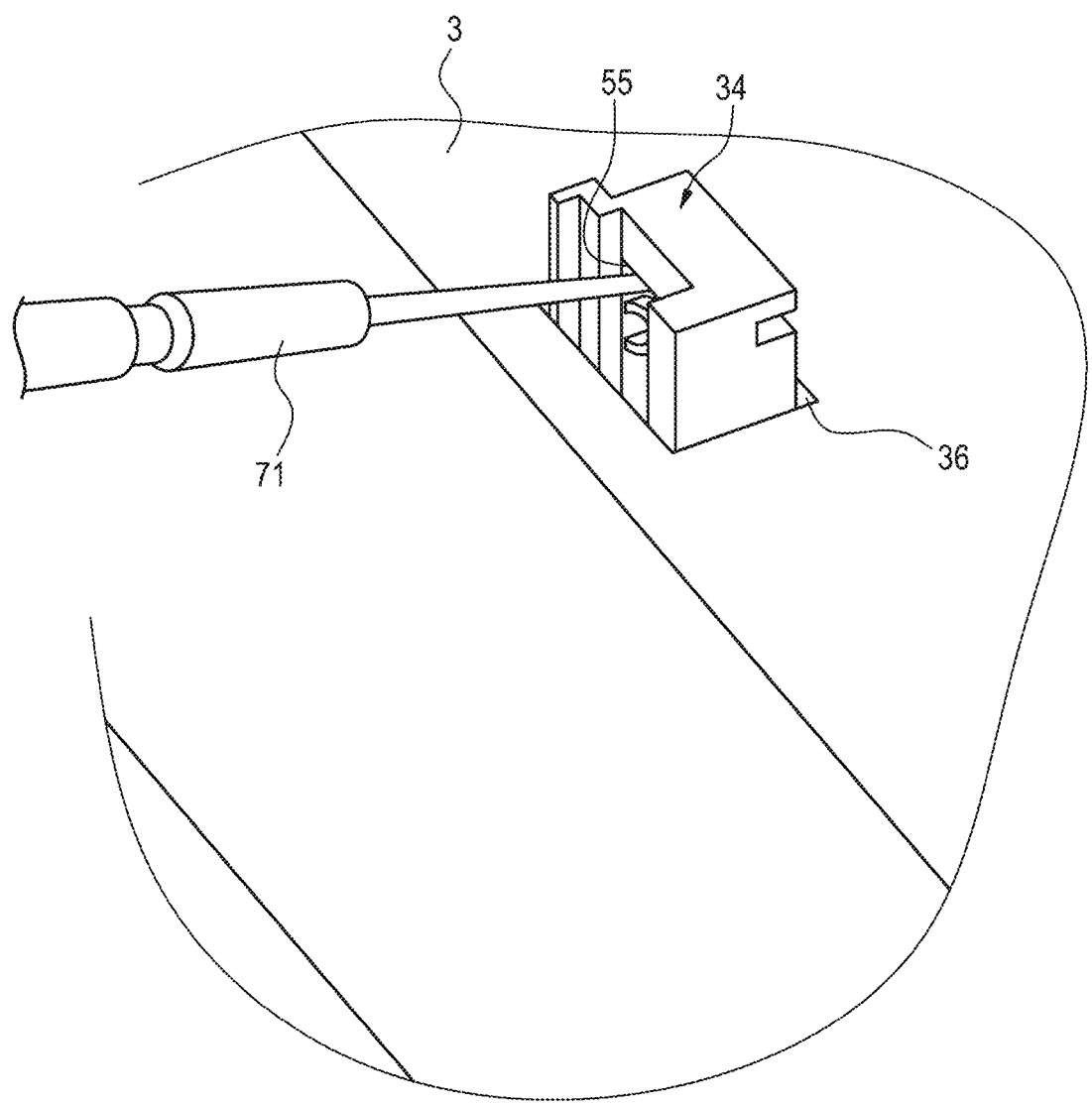
FIG. 8C is a view for describing the example of the pulling-out method of the clamp coupling body.

As illustrated in FIGS. 8B and 8C, the clamp coupling body 34 mounted to the insertion portion 36 of the frame 3 can be pulled out using a tool 71. For example, a flathead screwdriver can be used as the tool 71.

First, as illustrated in FIG. 8B, the tip of the tool 71 is inserted into the gap between the insertion portion 36 and the clamp coupling body 34, and further the tip of the tool 71 is inserted into the recess portion 55 (see FIG. 8A) not visible in FIG. 8B to hook the clamp coupling body 34. Subsequently, as illustrated in FIG. 8C, the clamp coupling body 34 is vertically pulled upward (in a direction indicated by an arrow A) in a state where the clamp coupling body 34 is hooked by the tool 71 (a state in which the tip of the tool 71 is in the recess portion 55). By further pulling up using the tool 71, the clamp coupling body 34 can be pulled out from the insertion portion 36 of the frame 3. Similarly, the other clamp coupling bodies 35, 44, and 45 can also be pulled out.

Next, a usage example of the tray unit 1 will be described.

Figure 9:
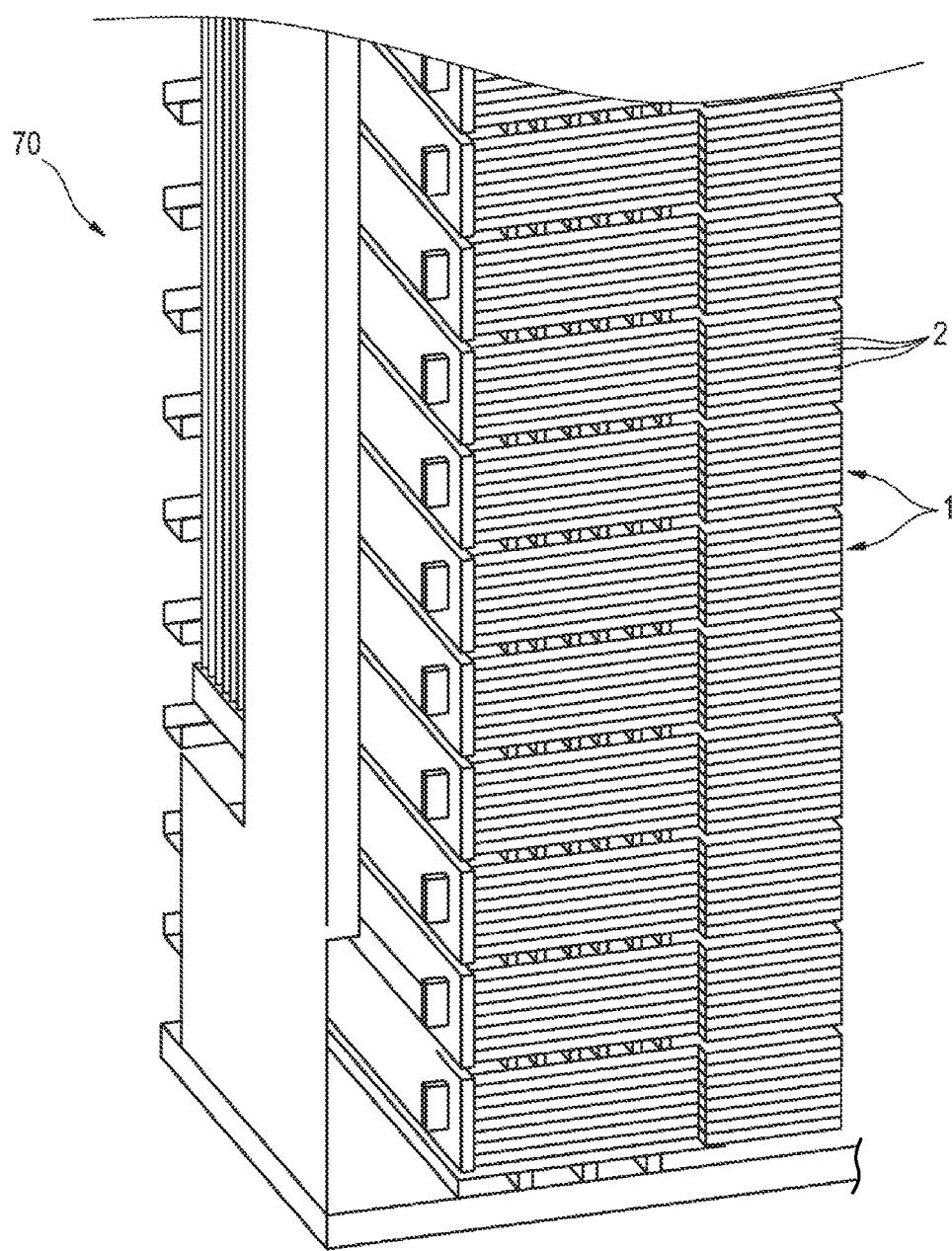
FIG. 9 is a view for describing a stacked state of a plurality of mounted tray units and illustrating the appearance of a portion of the rack.

The tray unit 1 is used by being mounted on a rack at a telephone station, a data center or the like, for example. FIG. 9 is a view illustrating the appearance of a portion of the rack for describing a stacked state of the mounted plural tray units 1. FIG. 9 illustrates a state where the tray units 1 are stacked in a plurality of tiers in the vertical direction to be mounted on a rack 70, and illustrates the stacked state to be easily understood by removing the side plates and the like of the rack 70.

Since the rail portions (33a to 33h and 43a to 43h: see FIG. 2 and the like) of the respective tiers of the tray unit 1, which is stacked in a plurality of tiers in the vertical direction to be mounted on the rack 70, have a relatively simple structure, the width of thereof is narrower (the height is lower) than the slide rail of the unit case in the related art. In addition, a plurality of tiers (eight tiers in the example) of trays 2 stacked in the vertical direction are accommodated in a single tier tray unit 1 mounted on the rack 70. Accordingly, the number of trays 2 that can be stacked on the rack 70 illustrated in FIG. 9 is larger than that in the case of using the unit case in the related art.

According to the tray unit 1 having the above structure, the rail portions 33a to 33h provided in plural tiers in the frame 3 are provided with the front clamps 34a to 34h and the rear clamps 35a to 35h, respectively. In addition, the rail portions 43a to 43h provided in plural tiers in the frame 4 are provided with the front clamps 44a to 44h and the rear clamps 45a to 45h, respectively. These rail portions are aligned in the vertical direction, each clamp is elastically deformed in the vertical direction, and the protrusions 23a and 23b of the tray 2 are fitted into the openings 53a to 53h, 54a to 54h, 63a to 63h, and 64a to 64h, thereby forming a relatively simple structure. Therefore, it is possible to lower the heights of the rail portions 33a to 33h and 43a to 43h, that is, the height per single tray, and to accommodate a plurality of tiers of trays 2 in one tray unit 1. Accordingly, for example, as illustrated in FIG. 9, when the tray unit 1 is stacked to be mounted on the rack 70, the tray accommodation size to the rack 70 in the vertical direction can be reduced. As a result, when a rack having the same height as in the related art is used, the number of stacked trays can be made larger than the case of the related art. Alternatively, it is possible to stack the same number of trays as in the related art on a rack lower than that of the related art.

Further, in the tray unit 1, the frames 3 and 4 and the clamp coupling bodies 34, 35, 44, and 45 are formed as separate structures. Since the frames and the clamp coupling bodies have a separate structure, it is easier to manufacture the tray unit 1 compared to the case of an integral structure. Further, since the tray unit 1 can be assembled by vertically inserting the clamp coupling bodies 34, 35, 44, and 45 into the frames 3 and 4, assembly work of the tray unit 1 is also easily performed.

In addition, the clamp coupling bodies 34, 35, 44, and 45 are vertically symmetrical. Accordingly, it is possible to reduce manufacturing costs by sharing the molds for manufacturing the respective clamp coupling bodies 34, 35, 44, and 45, for example. Further, when the clamp coupling bodies 34, 35, 44, and 45 are inserted into the frames 3 and 4, since the clamp coupling bodies 34, 35, 44, and 45 are asymmetric in the front-rear direction as viewed from the operator, the tray unit 1 can be assembled without mistaking the orientation of the front and rear.

Further, the clamp coupling bodies 34, 35, 44, and 45 include the recess portions 55 provided at the ends thereof in the horizontal direction. By inserting the tip of the tool 71 (for example, a flathead screwdriver) into the recess portion 55, the clamp coupling bodies 34, 35, 44, and 45 can be hooked and easily pulled out from the frames 3 and 4. Therefore, the maintenance work or the like of the tray 2 can be easily performed.

In the above embodiments, the clamps are respectively provided on the front side (34a to 34h and 44a to 44h) and the rear side (35a to 35h and 45a to 45h). However, the clamps may be provided on only one of the front side and the rear side. For example, if the clamps are provided only on the rear side, the protrusions 23a and 23b are fitted and fixed to the rear clamps 35a to 35h and 45a to 45h, whereby it is possible to prevent the position of the tray 2 from being displaced due to vibration of the rack or the like. Also, it is possible to freely perform accommodating and removing the respective trays 2 in and from the tray unit 1.

While the present invention has been described in detail and with reference to specific embodiments thereof, it will be apparent to those skilled in the art that various changes and modifications can be made without departing from the spirit and scope of the invention. Further, the number, the position, the shape, and the like of the above-described constituent members are not limited to those in the above embodiments, and can be changed to a suitable number, position, shape, and the like for implementing the present invention.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A tray unit comprising:
    a plurality of trays each of which has a protrusion at a side end portion thereof respectively; and
    a pair of frames each vertically provided with a plurality of tiers of rail portions and an insertion hole therethrough, the plurality of tiers of rail portions of each frame accommodating the plurality of trays in a slidable manner in a horizontal direction, wherein
    the rail portion at each tier includes a clamp on a surface facing a corresponding side end portion of a corresponding tray,
    the clamps in the plurality of tiers of each frame are aligned in a vertical direction and coupled together to form a clamp coupling body,
    each clamp has an opening to which a corresponding protrusion is fittable, and
    when the side end portions of the trays move to a predetermined position with respect to the rail portions, the clamps are each elastically deformed in the vertical direction of the rail portions, and the protrusions are fitted into the openings of the clamps,
    wherein each clamp coupling body is a separate structure from the frames, and each clamp coupling body is inserted within a corresponding insertion hole in the vertical direction with respect to each frame respectively to assemble the tray unit.

2. The tray unit according to claim 1, wherein each clamp coupling body is formed in a vertically symmetrical shape, and each clamp coupling body is asymmetric in a front to rear direction.

3. The tray unit according to claim 1, wherein each clamp coupling body includes a recess portion provided in the horizontal direction at upper and lower end portions thereof.

* * * * *